United States Patent
Ngo et al.

[11] Patent Number: 6,114,224
[45] Date of Patent: Sep. 5, 2000

[54] SYSTEM AND METHOD FOR USING $N_2O$ PLASMA TREATMENT TO ELIMINATE DEFECTS AT AN INTERFACE BETWEEN A STOP LAYER AND AN INTEGRAL LAYERED DIELECTRIC

[75] Inventors: Minh Van Ngo, Union City; Terri Jo Kitson, San Jose, both of Calif.

[73] Assignee: Advanced Micro Devices, Sunnyvale, Calif.

[21] Appl. No.: 09/172,325

[22] Filed: Oct. 13, 1998

Related U.S. Application Data

[63] Continuation-in-part of application No. 08/785,909, Jan. 21, 1997, Pat. No. 6,020,274.

[51] Int. Cl.[7] .................................................. H01L 21/322
[52] U.S. Cl. ........................ 438/474; 438/515; 438/528; 438/798
[58] Field of Search .................................. 438/474, 485, 438/513, 515, 528, 798; 257/760, 752, 649, 648, 640

[56] References Cited

U.S. PATENT DOCUMENTS

| | | | |
|---|---|---|---|
| 5,424,222 | 6/1995 | Arndt | 438/798 |
| 5,474,955 | 12/1995 | Thakur | 438/760 |
| 5,556,806 | 9/1996 | Pan et al. | 438/624 |
| 5,780,115 | 7/1998 | Park et al. | 427/539 |
| 5,807,660 | 9/1998 | Lin et al. | 430/313 |

FOREIGN PATENT DOCUMENTS

| | | |
|---|---|---|
| 047043734 | 2/1995 | Japan. |
| 08191068 | 7/1996 | Japan. |

*Primary Examiner*—Donald L. Monin, Jr.
*Assistant Examiner*—Hoai Pham
*Attorney, Agent, or Firm*—Brinks Hofer Gilson & Lione

[57] ABSTRACT

A system and method for using a nitrous oxide plasma treatment to eliminate defects at an interface between a stop layer and an integral layered dielectric. The system and method provide a reliable and simplified technology that eliminates the small bubble-like defects that can be common to thin nitride layers. The system includes a plasma device and a processing chamber. The method encompasses the steps of preparing a first integral layered dielectric on a substrate before depositing a stop layer thereupon. A plasma gas is then ionized. Preferably, the plasma gas is composed of nitrogen and oxygen. The stop layer is then exposed to the plasma gas until a primary surface of the stop layer is bombarded plane. A second integral layered dielectric is then formed on the primary surface. A top surface of the second integral layered dielectric is generally plane and parallel to the primary surface.

14 Claims, 2 Drawing Sheets

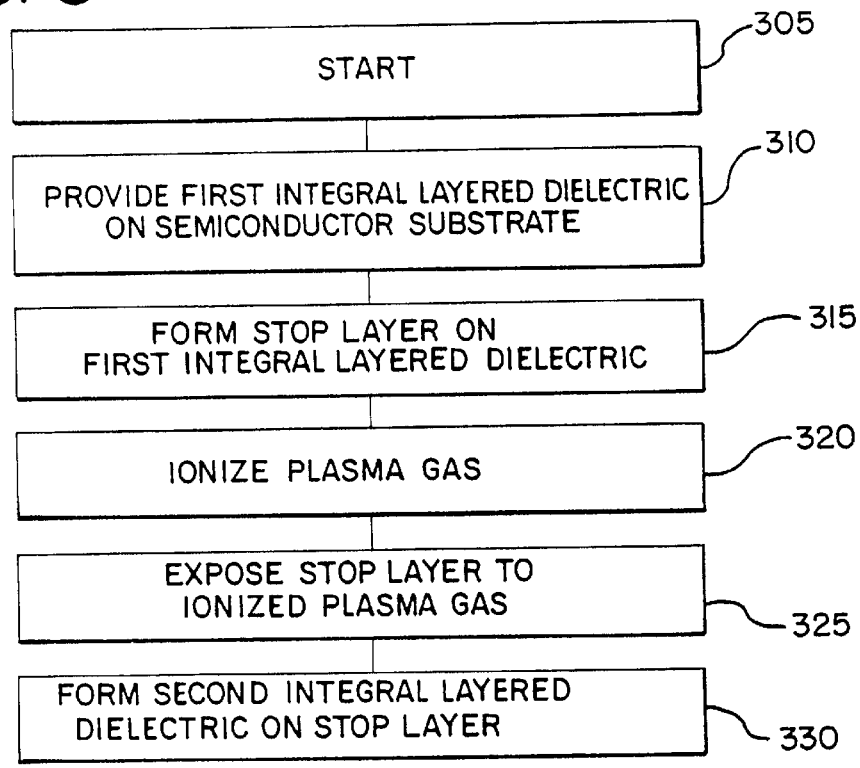
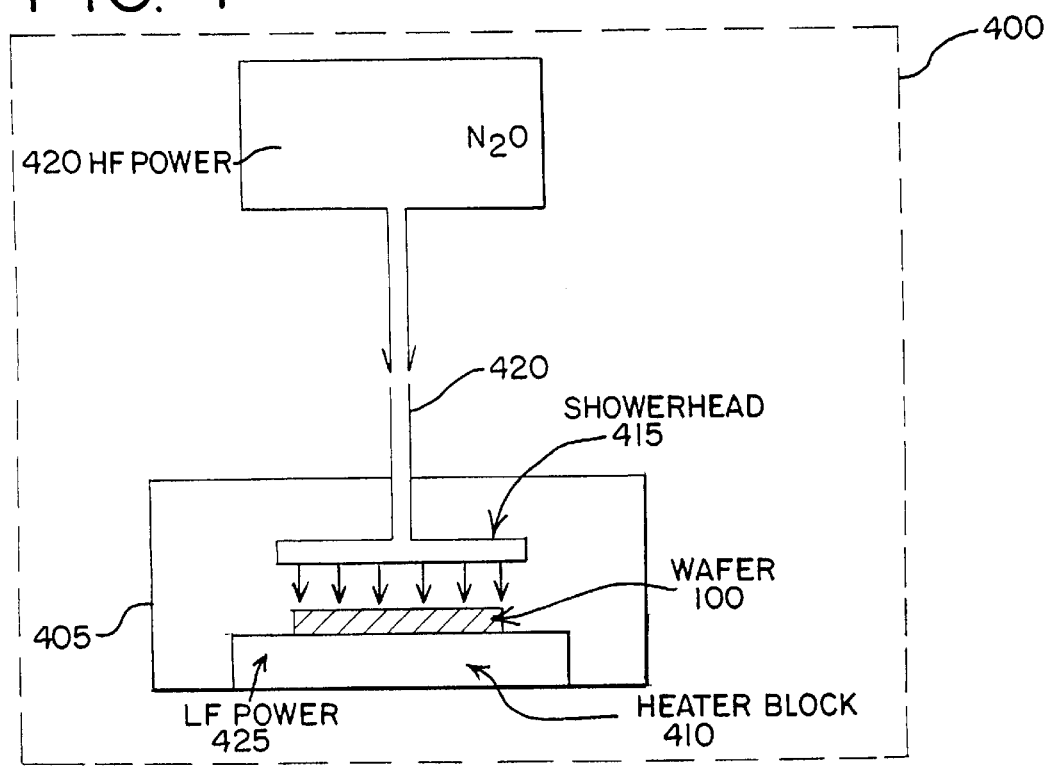

SYSTEM AND METHOD FOR USING $N_2O$ PLASMA TREATMENT TO ELIMINATE DEFECTS AT AN INTERFACE BETWEEN A STOP LAYER AND AN INTEGRAL LAYERED DIELECTRIC

RELATED REFERENCE

This application is a continuation-in-part of U.S. patent application Ser. No. 08/785,909, filed Jan. 21, 1997, now U.S. Pat. No. 6,020,274 entitled "A Method and System for Using N2 Plasma Treatment to Eliminate the Outgassing Defects at the Interface of a Stop Layer and an Oxide Layer," commonly owned by the assignee of this application, the contents of which are incorporated herein by reference.

BACKGROUND OF THE INVENTION

1. Technical Field of the Invention

The present invention relates to a system and method for eliminating defects at an interface between a stop layer and an integral layered dielectric.

2. Description of the Related Art

Semiconductor devices, such as complementary metal-oxide semiconductor transistors, are used in applications requiring high-speed and low power. These transistors, commonly used in microprocessors, memory devices, and gate arrays, for example, may be fabricated by conventional manufacturing methods. One method begins by bonding silicon dioxide layers to a silicon substrate. A plasma current then selectively exposes selected silicon dioxide layers creating exposed silicon sectors partitioned by a non-etched area. The exposed silicon sectors are then implanted with impurities to create a source and a drain. A conductive layer is deposited between the source and the drain creating a gate. Additional conductive layers disposed between the source and the drain provide electrical conductivity to ancillary elements. These layers also provide bonding pads to facilitate external connections. The bonding pads commonly connected to a transistor by conductive and interlayer connections are often separated by dielectric material. There are, of course, many other steps to manufacturing semiconductor devices.

As circuits are commonly etched in layers, silicon substrates often need to be isolated. A known method for accomplishing silicon substrate isolation disposes a nitride stop layer above a silicon substrate and a first integral layered dielectric. Thereafter, a second integral layered dielectric is disposed above the nitride stop layer. A problem that may occur at the interface of the nitride stop layer and the second integral layered dielectric is the creation of small bubble-like defects 10 that become exaggerated at the surface of the second integral layered dielectric 20 as illustrated in FIG. 1. These defects may affect semiconductor reliability and may create poison contact faults.

A known method for eliminating these small bubble-like defects 10 utilizes a wet cleaning technique that subjects a semiconductor wafer to an RCA (Radio Corporation of America) wet cleaning process and then submerses the semiconductor wafer in a hydroflouride dip. Wet cleaning techniques, however, may create pinhole defects on thin nitride layers. Additionally, wet cleaning techniques result in longer cycle times and require additional wafer handling that can lead to wafer contamination and lower semiconductor yields.

With growing requirements of improved reliability, reduced cost, increased yields, and simplified manufacturing processes, there is a demand for a system and a method that eliminates defects between the stop layer and the second integral layered dielectric. The system and method should reduce or eliminate defects at an interface of the nitride stop layer and the second integral layered dielectric. It should further provide a system and method that is compatible with existing semiconductor fabrication technology.

SUMMARY OF THE INVENTION

The invention provides a system and a method for minimizing or eliminating defects in the manufacturing of semiconductor devices. The method comprises the steps of preparing a semiconductor layer having a substrate supporting a first integral layered dielectric underlying a stop layer underlying a second integral layered dielectric. The first integral layered dielectric is formed on the substrate before the stop layer is deposited thereupon. A gas plasma treatment is then initiated. Preferably, the plasma gas treatment ionizes nitrous oxide. The stop layer having a primary surface is then exposed to the plasma gas treatment until the primary surface is bombarded to form a planar surface. The second integral layered dielectric having a top surface is then formed on the stop layer. The top surface of the second integral layered dielectric is generally plane and parallel to the primary surface of the stop layer.

Another aspect of this invention involves a semiconductor fabricating system for reducing defects between substrate layers. The semiconductor fabricating system comprises a plasma device and a processing device. The plasma device is used to ionize a plasma gas. The processing device exposes a primary surface of a stop layer to the plasma gas for a period of time sufficient to planarize the primary surface before forming an integral layered dielectric on the primary surface. The integral layered dielectric has a top surface generally planar and parallel to the primary surface of the stop layer.

The disclosed system and method reduces or eliminates defects at an interface between the stop layer and the integral layered dielectric creating improved semiconductor devices. The system and method further provide a reliable semiconductor interface that results in higher semiconductor yields. The technology that provides this system and method is compatible with existing semiconductor fabrication hardware, further rendering a low-cost highly flexible technology designed to support a variety of semiconductor platforms. These features as well as other advantages of the invention will become apparent upon consideration of the following detailed description and accompanying drawings of the presently preferred embodiments of the invention described below.

BRIEF DESCRIPTION OF THE DRAWINGS

FIG. 3 is a flow chart of a preferred embodiment of the nitrous oxide gas plasma treatment process.

FIG. 4 is a diagram of a system used in the nitrous oxide gas plasma treatment process.

DETAILED DESCRIPTION OF THE PRESENTLY PREFERRED EMBODIMENTS

Figure 1:
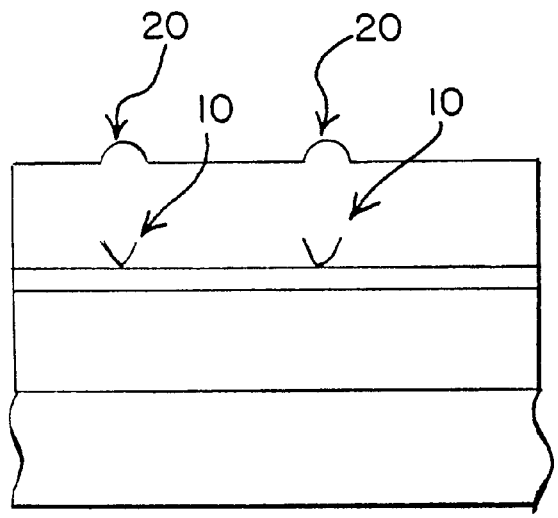
FIG. 1 is a cross-sectional view of prior art semiconductor layers illustrating the defects of prior art manufacturing processes.

In the drawings, depicted elements are not necessarily drawn to scale, and alike and similar elements are designated by the same reference numeral through several views.

Figure 2:
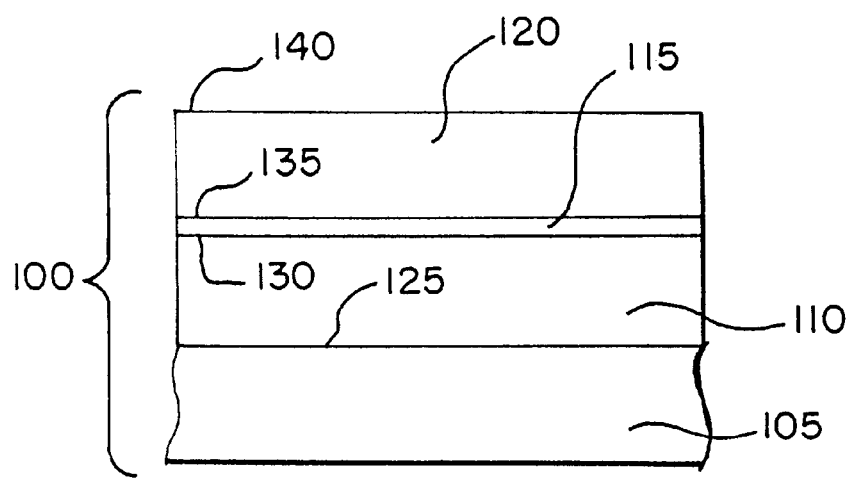
FIG. 2 is a cross-sectional view of semiconductor layers manufactured according to the system and method of the invention.

FIG. 2 shows a cross-sectional view of a plurality of semiconductor layers 100. As shown, a semiconductor containing multiple layers 100 comprises a substrate 105, a first integral layered dielectric 110, a stop layer 115, and a second integral layered dielectric 120. The substrate 105 is preferably a conventional semiconductor substrate composed of silicon (Si). The first integral layered dielectric 110 preferably comprises a silicon dioxide (SiO$_2$) layer formed to a thickness on the order of about 5,000 Ångstrom units. The stop layer 115 preferably comprises a silicon nitride (SiN) layer, which is thinner than the first integral layered dielectric 110 and preferably has a thickness on the order of about 500 Ångstrom units. The second integral layered dielectric 120 also preferably comprises a silicon dioxide layer formed to a thickness on the order of about 5,000 Ångstrom units.

According to a first embodiment illustrated in FIGS. 2 and 3, a semiconductor manufacturing method is used to form the layers described above. Utilizing conventional depositing techniques, such as a Plasma Enhanced Chemical Vapor Deposition (PECVD), the first integral layered dielectric 110, is deposited on the semiconductor substrate 105 (step 310). The stop layer 115 is then formed on an uncovered upper surface 130 of the first integral layered dielectric 110 (step 315). The stop layer 115 is preferably formed to completely cover the upper surface 130 of the first integral layered dielectric 110.

A gas plasma treatment process is then controllably applied to the stop layer 130. Specifically, the semiconductor layers comprising the silicon substrate 105, the first integral layered dielectric 110, and the stop layer 115 are placed in a controlled gas atmosphere. The controlled gas atmosphere comprises a plasma gas preferably comprising nitrous oxide (N$_2$O). When a high and a low radio frequency power are applied, the nitrous oxide gas is ionized creating nitride (N) and oxide (O) ions (step 320). When the stop layer 115 is exposed to the ionized gas, the physical collisions between the stop layer 115 and the nitride and oxide ions reduces or eliminates the small bubble-like defects 10, 20 (seen in FIG. 1) that inherently form at an interface between the stop layer 115 and a second integral layered dielectric 120 (step 325). The collisions therefore substantially planarize a primary surface 135 of the stop layer 115. The above described process has effectively eliminated defects uniformly on the range of approximately 0.07 μm to 0.1 μm that become exaggerated at a free surface 140 of the second integral layered dielectric 120.

The second integral layered dielectric 120 is then formed on the primary surface 135 of the stop layer 115 by preferably employing a PECVD process (step 330). The second integral layered dielectric 120 has a top surface 140, which is thus formed to be generally planar and parallel to the primary surface 135 of the stop layer 115. By forming the second integral layered dielectric 120 on the treated primary surface 135, surface defects in the range of approximately 0.2 μm to 0.5 μm were eliminated from the top surface 140.

In the presently preferred embodiment of the invention, the plasma treatment process is performed in a gas atmosphere. The stop layer 115 was bombarded with the plasma gas treatment under the following preferred conditions.

| Nitrous oxide: | |
|---|---|
| Flow Rate | 400 to 1,000 sccm |
| Power Range: | |
| High Frequency | 600 to 1,000 watts |
| Low Frequency | 200 to 400 watts |
| Pressure: | 2.0 to 3.0 torr |
| Temperature: | 380 to 420 centigrade |
| Time/Duration: | 5 to 45 seconds |

The plasma treatment process described above utilizes nitrous oxide as the preferred plasma gas. The source of the nitrous oxide plasma gas may be from a source that combines dinitrogen with an oxide, or may comprise a separate source of nitrous oxide gas. The plasma treatment process is preferably performed in a processing chamber 405 as shown in FIG. 4. The processing chamber 405 provides means for exposing the stop layer 115 to the plasma gas treatment. Here, the plasma treatment process occurs in the processing chamber 405 within the gas flow rates, power frequency levels, pressure, temperature, and timed exposure ranges shown above.

The aforementioned embodiments were created using a system 400 for reducing defects between substrate layers. The system 400 comprises a plasma device 420 and a processing chamber 405. As shown in FIG. 4, the processing chamber 405 comprises a heating source 410, a showerhead 415, and a gas inlet 420 with accompanying connectors for a high frequency power source 420 and low frequency power source 425. In an alternative embodiment, the system 400 can comprise a programmable power supply and a positioning device for positioning the substrate layers at a processing position. In the preferred embodiment, the system 400 employed is a Concept I System manufactured by Novellus of San Jose, Calif.

The disclosed embodiments provide an improved interface between the stop layer 115 and the second integral layered dielectric 120, which simplifies semiconductor fabrication and minimizes contamination by integrating an ion bombarding process with a Plasma Enhanced Chemical Vapor Deposition process. The embodiments may be employed in zero defect tolerance environments and are cost-effective. The disclosed embodiments enjoy utility in any semiconductor fabrication facility or total quality semiconductor-manufacturing environment.

Those skilled in the art will implement the steps necessary to provide the system and methods disclosed herein and understand that the process parameters including the plasma treatment flow rates, high and low frequency power ranges, pressure, temperature and time of exposure ranges can be altered according to the intrinsic and extrinsic properties of the integral layered dielectrics 120 and 125, the stop layer 115, and the plasma gas.

Variations and modifications of the embodiments disclosed herein may be made without departing from the scope and spirit of the invention. The aforementioned description is intended to be illustrative rather than limiting and it is understood that the following claims and their equivalents set forth the scope of the invention.

What is claimed is:

1. A method of manufacturing a semiconductor device, comprising the steps of:

providing a first integral layered dielectric on a semiconductor substrate;

forming a stop layer on the first integral layered dielectric, the top layer comprising silicon nitride;

ionizing a plasma gas;

exposing the stop layer to the ionized plasma gas until a primary surface of the stop layer is substantially planarized; and forming a second integral layered dielectric on the primary surface, the second integral layered dielectric having a top surface generally planar and parallel to the primary surface of the stop layer.

2. The method of manufacturing a semiconductor device according to claim 1, wherein the second integral layered dielectric has a thickness at least equal to the first integral layered dielectric.

3. The method of manufacturing a semiconductor device according to claim 1, wherein the plasma gas formed contains at least nitrogen and oxygen and the stop layer consists of silicon and nitrogen.

4. The method of manufacturing a semiconductor device according to claim 1, wherein the plasma gas consists of nitrous oxide and the stop layer consists of silicon and nitrogen.

5. The method of manufacturing a semiconductor device according to claim 4, wherein the nitrous oxide is within a range of about four-hundred to one-thousand sccm.

6. The method of manufacturing a semiconductor device according to claim 1, wherein the step of exposing the stop layer to the plasma gas further comprises the step of bombarding the stop layer with the plasma gas at a low frequency power range between about two-hundred and four-hundred watts and at a high frequency power range between about six-hundred and one-thousand watts.

7. The method of manufacturing a semiconductor device according to claim 1, wherein the step of exposing the stop layer to the plasma gas occurs at a temperature range between about three-hundred and eighty degrees to four-hundred and twenty degrees celsius.

8. The method of manufacturing a semiconductor device according to claim 1, wherein the step of exposing the stop layer to the plasma gas occurs at a pressure range between about two to three torr.

9. The method of manufacturing a semiconductor device according to claim 1, wherein the step of exposing the stop layer to the plasma gas occurs for approximately five to forty-five seconds.

10. The method of manufacturing a semiconductor device according to claim 1, wherein the step of exposing the stop layer to the plasma gas further comprises the step of bombarding the stop layer with the plasma gas at a low frequency power range between about two-hundred to four-hundred watts, at a high frequency power range between about six-hundred and one-thousand watts, at a temperature range between about three-hundred and eighty to four-hundred and twenty degrees celsius, at a pressure range between about two to three torr for approximately five to forty-five seconds.

11. The method of manufacturing a semiconductor device according to claim 1, wherein the first and the second integral layered dielectric have a thickness on the order of about five-thousand Ångstrom units and the stop layer has a thickness on the order of about five-hundred Ångstrom units.

12. The method of manufacturing a semiconductor device according to claim 1, wherein the substrate comprises silicon, the first integral layered dielectric and the second integral layered dielectric comprise silicon dioxide, the stop layer consists of silicon nitride, and the plasma gas consists of nitrous oxide, and the step of exposing the stop layer to the plasma gas further comprises the step of bombarding the stop layer with the plasma gas at a rate of about four-hundred to one-thousand sccm, at a low frequency power range between about two-hundred to four-hundred watts, at a high frequency power range between about six-hundred to one-thousand watts, at a temperature range between about three-hundred and eighty degrees to four-hundred and twenty degrees celsius, at a pressure range between about two to three torr for approximately five to forty-five seconds.

13. The method of manufacturing a semiconductor device according to claim 12, wherein the first and the second integral layered dielectrics each have a thickness on the order of about five-thousand Ångstrom units and the stop layer has a thickness on the order of about five-hundred Ångstrom units.

14. A method of manufacturing a semiconductor device, comprising the steps of:

providing a first integral layered dielectric on a semiconductor substrate, the first integral layered dielectric comprising silicon dioxide;

forming a stop layer on the first integral layered dielectric, the stop layer comprising silicon nitride;

ionizing a plasma gas consisting of nitrous oxide;

exposing the stop layer to the plasma gas at a rate of about four-hundred to one-thousand sccm, at a low frequency power range between about two-hundred to four-hundred watts, at a high frequency power range between about six-hundred to one-thousand watts, at a temperature range between about three-hundred and eighty degrees to four-hundred and twenty degrees celsius, at a pressure range between about two to three torr for approximately five to forty-five seconds to planarize a primary surface of the stop layer; and forming a second integral layered dielectric on the primary surface, the second integral layered dielectric comprising silicon dioxide and having a top surface generally planar and parallel to the primary surface of the stop layer.

* * * * *